(12) United States Patent
Eichenfield et al.

(10) Patent No.: US 10,666,222 B1
(45) Date of Patent: May 26, 2020

(54) HYBRID SEMICONDUCTOR-PIEZOACOUSTIC RADIOFREQUENCY DEVICE

(71) Applicant: National Technology & Engineering Solutions of Sandia, LLC, Albuquerque, NM (US)

(72) Inventors: Matt Eichenfield, Albuquerque, NM (US); Roy Olsson, Arlington, VA (US); Anna Tauke-Pedretti, Albuquerque, NM (US); Andrew Leenheer, Albuquerque, NM (US); Aleem Siddiqui, Albuquerque, NM (US); Thomas A. Friedmann, Albuquerque, NM (US)

(*) Notice: Subject to any disclaimer, the term of this patent is extended or adjusted under 35 U.S.C. 154(b) by 449 days.

(21) Appl. No.: 15/718,817

(22) Filed: Sep. 28, 2017

Related U.S. Application Data

(60) Provisional application No. 62/404,685, filed on Oct. 5, 2016.

(51) Int. Cl.
*H03H 9/02* (2006.01)
*H01L 41/313* (2013.01)
(Continued)

(52) U.S. Cl.
CPC ....... *H03H 9/02976* (2013.01); *H01L 41/047* (2013.01); *H01L 41/313* (2013.01);
(Continued)

(58) Field of Classification Search
CPC .. H03H 9/02976; H03H 3/08; H03H 9/02559; H03H 9/02566; H03H 9/058
(Continued)

(56) References Cited

U.S. PATENT DOCUMENTS 6,046,524 A * 4/2000 Yamanouchi ........... H03F 13/00
310/313 R

OTHER PUBLICATIONS

Coldren, L. A. et al., "Monolithic Acoustic Surface-Wave Amplifier", Applied Physics Letters, 1971, pp. 317-319, vol. 18.
(Continued)

*Primary Examiner* — Derek J Rosenau
(74) *Attorney, Agent, or Firm* — Martin I. Finston; Mark A. Dodd

(57) ABSTRACT

An amplifying radiofrequency device includes a piezoelectric film and a semiconductor amplifier layer. The piezoelectric film is conformed as an acoustic waveguide. The piezoelectric film has a principal acoustic propagation direction parallel to the principal conduction direction of the amplifier layer. Interdigitated transducers are positioned on the piezoelectric film to respectively launch an acoustic wave in response to an input RF signal, and transduce the acoustic wave back to an output RF signal. There is a distance of less than the acoustic wavelength between the semiconductor amplifier layer and the piezoelectric film. The piezoelectric film has a thickness of less than the acoustic wavelength. According to a method for making such a device, a stack of III-V layers is epitaxially grown on a III-V substrate, wherein the stack comprises a first etch stop layer, a second etch stop layer, an amplifier layer, and a contact layer. The stack is bonded to a lithium niobate film. The III-V substrate is removed by etching down to the first etch stop layer. Deposition windows are opened by etching from the first etch stop layer down to the contact layer. Metal contact electrodes are deposited in the deposition windows.

13 Claims, 13 Drawing Sheets

(51) Int. Cl.
H03H 9/145 (2006.01)
H03H 3/08 (2006.01)
H01L 41/047 (2006.01)
H03H 9/05 (2006.01)

(52) U.S. Cl.
CPC .......... H03H 3/08 (2013.01); H03H 9/02559 (2013.01); H03H 9/02566 (2013.01); H03H 9/058 (2013.01); H03H 9/14514 (2013.01)

(58) Field of Classification Search
USPC ...... 310/313 R, 313 A, 313 B, 313 C, 313 D
See application file for complete search history.

(56) References Cited

OTHER PUBLICATIONS

Coldren, L. A. et al., "cw monolithic acoustic surface wave amplifier incorporated in v/v waveguide", Applied Physics Letters, 1973, pp. 117-118, vol. 23.

Eichenfield, M. et al., "Acoustoelectric Devices: Then and Now", SAND2015-8536PE, Sandia National Laboratories, 2015.

Eichenfield, M. et al., "Design, fabrication, and measurement of RF IDTs for efficient coupling to wavelength-scale structures in thin piezoelectric films", 2013 Joint UFFC, EFTF and PFM Symposium, pp. 753-756.

Kino, G. S. et al., "A Normal Mode Theory for the Rayleigh Wave Amplifier", IEEE Transactions on Electron Devices, 1971, pp. 909-920, vol. Ed-18.

Kino, G.S. et al., "Noise figure calculation for the Rayleigh wave amplifier", Applied Physics Letters, 1973, pp. 50-52, vol. 22.

Lakin, K. M. et al., "Surface Wave Delay Line Amplifiers", IEEE Transactions on Microwave Theory and Techniques, 1969, pp. 912-920, vol. MTT-17.

Liang, K. et al., "Precision measurement of Rayliegh wave velocity perturbation", Applied Physics Letters, 1982, pp. 1124-1126, vol. 41.

Olsson, R.H. et al., "A high electromechanical coupling coefficient SH0 Lamb wave lithium niobate micromechanical resonator and a method for fabrication", Sensors and Actuators A, 2014, pp. 183-190, vol. 209.

Tauke-Pedretti, A. et al., "Bonded inGaAs Cell for Microsystems Enabled Photovoltaics", 2014 IEEE 40th Photovoltaic Specialists Conference (PVSC), 0546-0549 (2014); published online Epub2014 (10.1109/pvsc.2014.6924979).

Tauke-Pedretti, A. et al., "Integrating III-V Compound Semiconductors with Silicon for Advanced Multijunction Solar Cells", SAND2015-0772C (2015).

White, R. et al., "Surface Elastic-Wave Propagation and Amplification", IEEE Transactions on Electron Devices, 1967, pp. 181-189, vol. ED-14.

Yamanouchi, K. et al., "Propagation and Amplification of Rayleigh Waves and Piezoelectric Leaky Surface Waves in LiNbO3", Journal of Applied Physics, 1972, pp. 856-862, vol. 43.

* cited by examiner

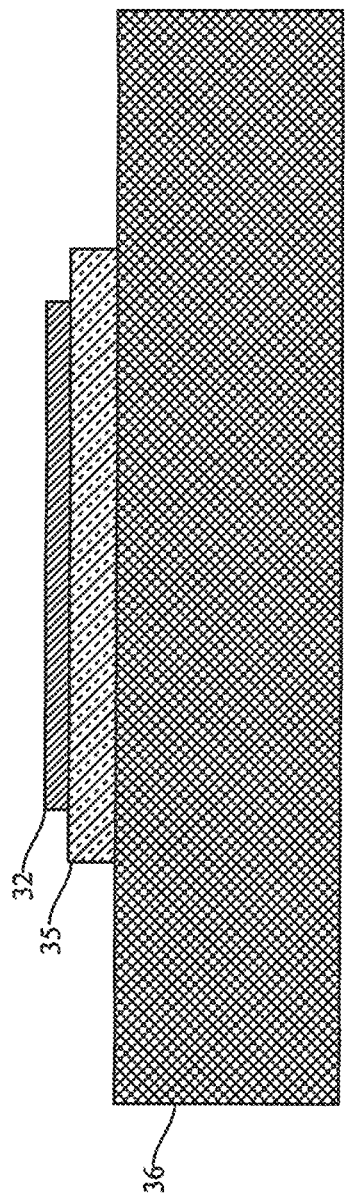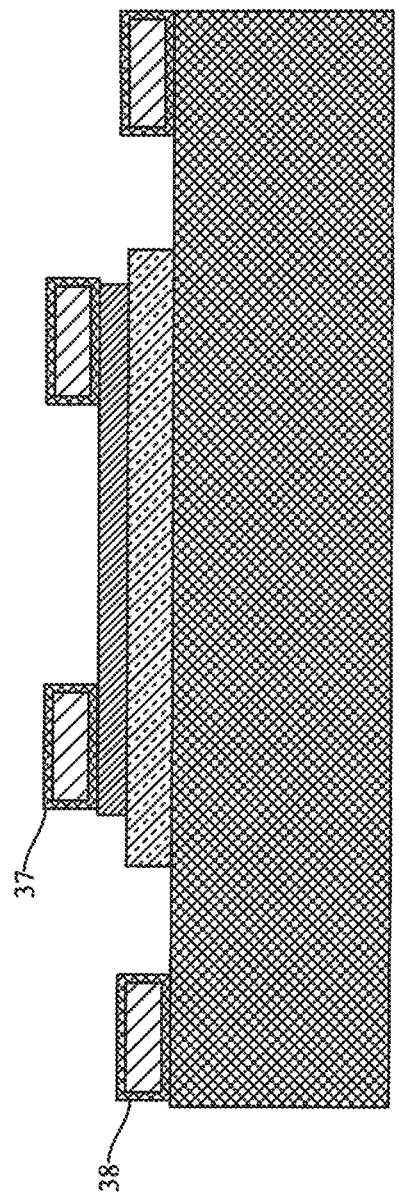

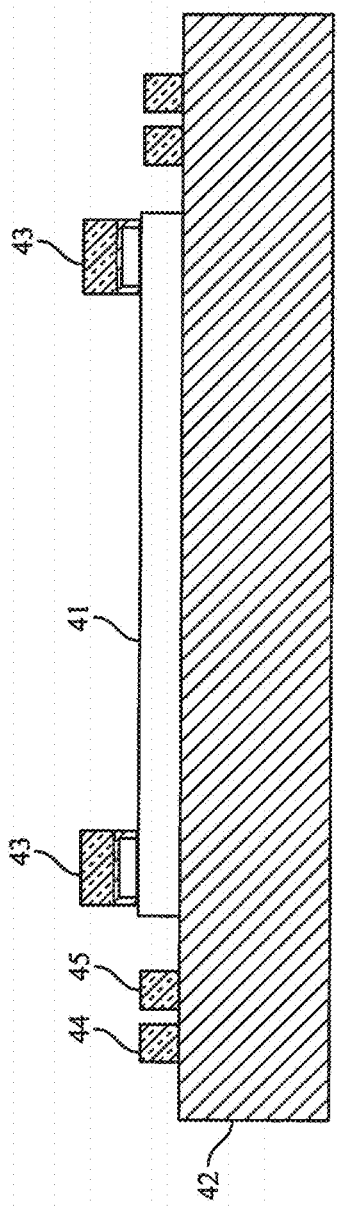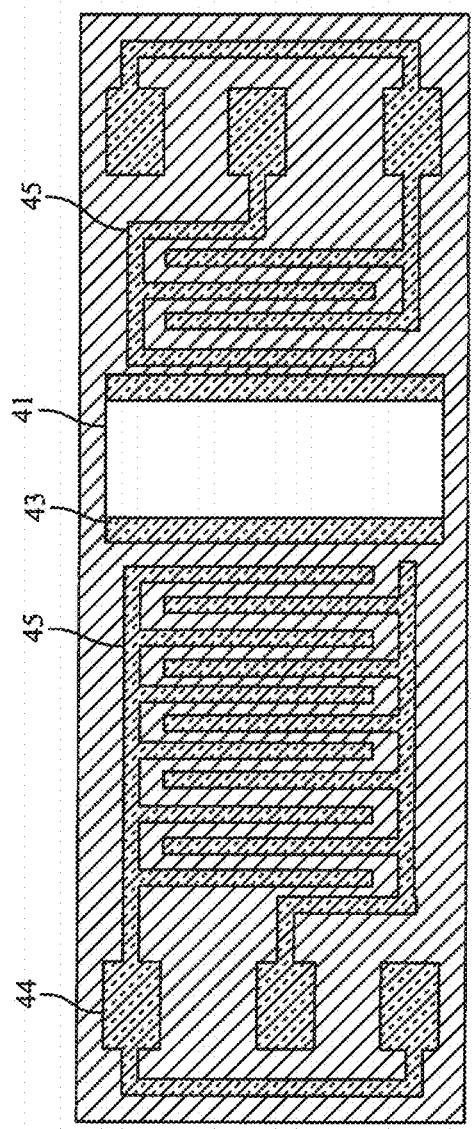
FIG. 4A
FIG. 4B

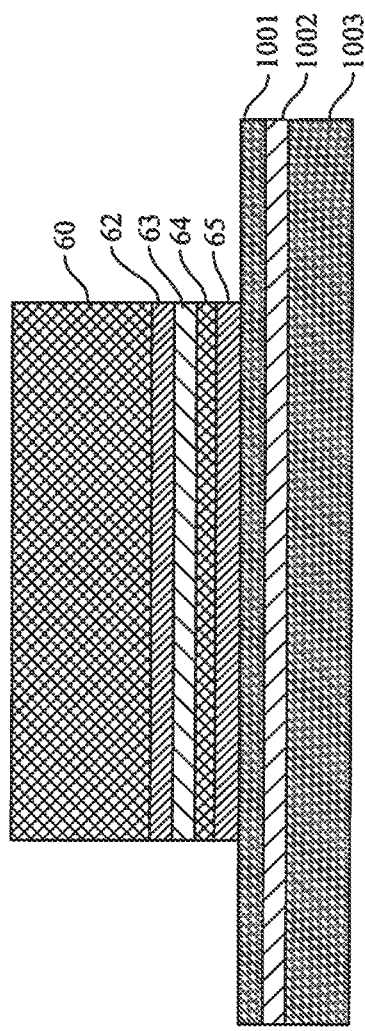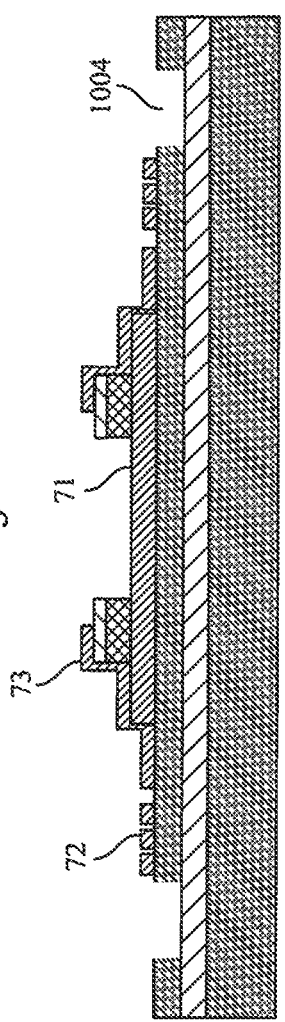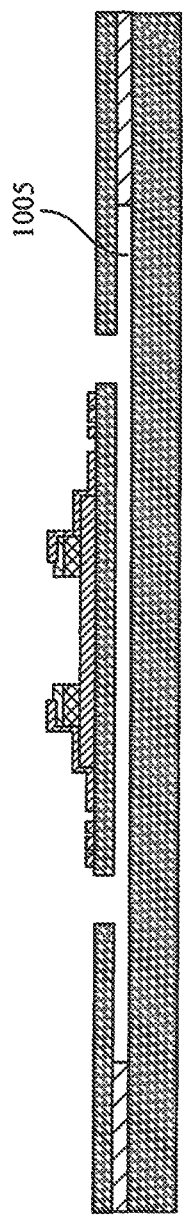

HYBRID SEMICONDUCTOR-PIEZOACOUSTIC RADIOFREQUENCY DEVICE

CROSS-REFERENCE TO RELATED APPLICATION

This application claims the benefit of U.S. Provisional Application No. 62/404,685, filed Oct. 5, 2016, the entirety of which is hereby incorporated herein by reference.

ACKNOWLEDGEMENT OF GOVERNMENT SUPPORT

This invention was made with Government support under Contract No. DE-AC04-94AL85000 between Sandia Corporation and the U.S. Department of Energy. The Government has certain rights in the invention.

FIELD OF THE INVENTION

The invention relates to devices for radio-frequency signal processing that use piezoelectric materials.

ART BACKGROUND

Piezoelectric acoustic devices are of great interest for radio frequency (RF) signal processing. Because these devices efficiently convert electromagnetic waves to acoustic waves (and back), the geometrical area that is required for signal processing is reduced by a large factor, comparable to $(c/v)^2$, where c is the speed of light and v is the speed of sound. This factor is very large, typically on the order of $10^9$. This has led to very substantial miniaturization of passive components such as resonators, filters, and delay lines.

It has long been known that the acoustic waves in piezoelectric acoustic devices are intrinsically accompanied by evanescent electric fields. Since the late 1960s, it has also been known that these evanescent fields can interact with traveling semiconductor currents in a manner that produces gain. This gain depends sensitively on the propagation velocity of the charge carriers relative to the acoustic wave. Indeed, if the acoustic wave and the charge carriers propagate in opposite directions, the system experiences attenuation rather than gain. Hence, the gain is highly non-reciprocal.

Early investigators of hybrid semiconductor-piezoacoustic systems, notably in the 1960s to the 1980s, demonstrated highly nonreciprocal amplifiers, oscillators, and even correlators. Some of these devices had great promise; demonstrations included amplifiers with tens of decibels of gain per millimeter and delay lines with 100 dB of non-reciprocity.

However, these systems were not competitive in noise performance with transistor-based active RF components, and interest consequently waned. The source of excess noise was well understood, but it was also understood that a practical level of performance could not be achieved with the available materials and fabrication capabilities of the day.

However, recent advances in Lamb wave piezoacoustic devices, heterogeneous integration of epitaxial semiconductors, and multiphysics simulation have rekindled the hope for new devices that can provide the functionality of the archetypal devices of the 1960s-1980s, but without excess noise.

SUMMARY OF THE INVENTION

We have taken a step toward providing such devices. According to the new ideas presented here, an active and non-reciprocal piezoelectric acoustic device is made by placing a current-carrying semiconductor device in close proximity (i.e., within a distance less than an acoustic wavelength) to an acoustic waveguide that is much thinner than the acoustic wavelength. In the following discussion, we will refer to the current-carrying semiconductor device as the "amplifer".

The acoustic waveguide may also be narrower than an acoustic wavelength in the transverse direction that lies in the plane of the device. Reducing the thickness of the acoustic waveguide reduces its density of acoustic states. Reducing its width as well as its thickness will reduce the density of states even further. This, in turn, can offer the benefit of reducing broadband noise in the output of the system.

The acoustic waveguide may be provided in the form of a suspended membrane. Although not critical, the isolation that such an arrangement provides helps to reduce the loss of acoustic energy into nearby structures such as the amplifier and its substrate. This, in turn, relaxes fabrication requirements by permitting the use of relatively thick semiconductor bodies.

Systems of the kind to be described here can produce low-noise gain that is highly nonreciprocal. This allows the manufacture of active and/or non-reciprocal RF components in highly miniaturized form factors. Examples include amplifiers, circulators, isolators, oscillators, and correlators.

Accordingly, the invention in a first aspect relates to an amplifying radiofrequency device that includes a piezoelectric film and a semiconductor amplifier layer. The piezoelectric film is conformed as an acoustic waveguide. The piezoelectric film has a principal acoustic propagation direction parallel to the principal conduction direction of the amplifier layer. Interdigitated transducers are positioned on the piezoelectric film to respectively launch an acoustic wave in response to an input RF signal, and to transduce the acoustic wave back to an output RF signal. There is a distance of less than the acoustic wavelength between the semiconductor amplifier layer and the piezoelectric film. The piezoelectric film has a thickness of less than the acoustic wavelength.

In a second aspect, the invention relates to a method for making a radiofrequency device of the kind described above. According to such a method, a stack of III-V layers is epitaxially grown on a III-V substrate, wherein the stack comprises a first etch stop layer, a second etch stop layer, an amplifier layer, and a contact layer. The stack is bonded to a lithium niobate film. The III-V substrate is removed by etching down to the first etch stop layer. Deposition windows are opened by etching from the first etch stop layer down to the contact layer. Metal contact electrodes are deposited in the deposition windows.

BRIEF DESCRIPTION OF THE DRAWINGS

FIGS. 3A-3E provide an illustrative example of a process for making a device in which an indium arsenide (InAs)

semiconductor amplifier layer is bonded to a lithium niobate piezoelectric acoustic waveguide layer.

FIGS. 4A and 4B provide, respectively, a simplified side-elevational view and a simplified plan view of an example hybrid amplifying device in which an indium gallium arsenide (InGaAs) amplifier is bonded to a lithium niobate acoustic waveguide.

FIGS. 5A-5K are a sequence of cross-sectional views (not to scale) illustrating the steps in an example process for making the device of FIGS. 4A and 4B.

Figure 5A:
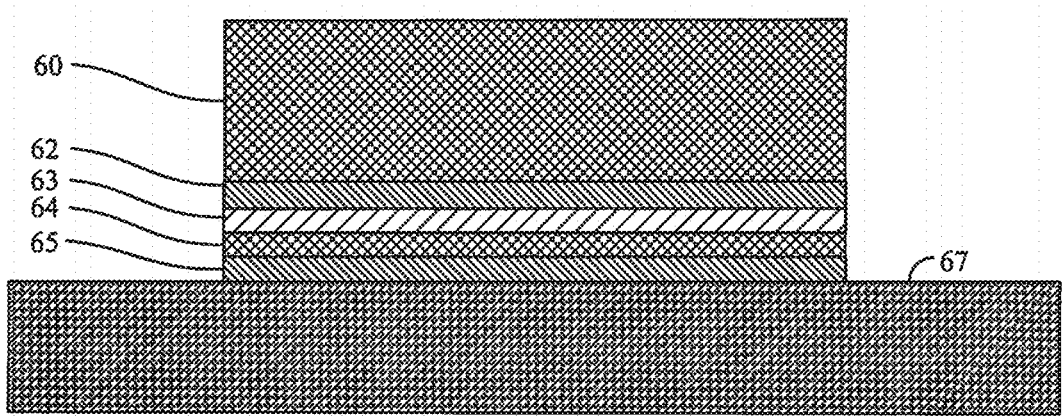
Figure 5B:
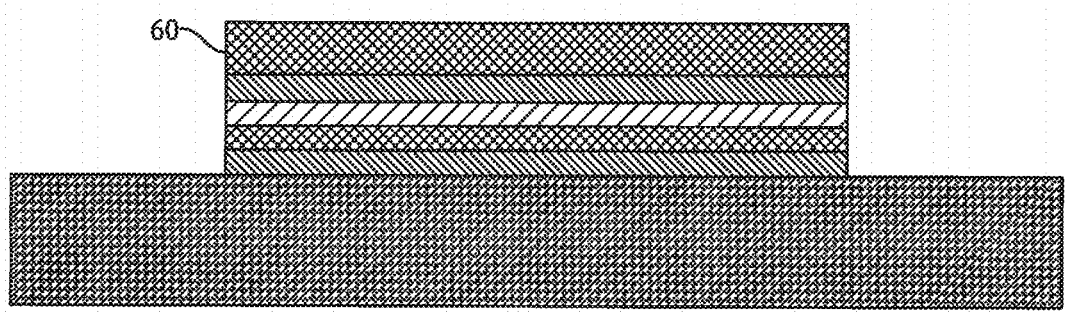
Figure 5C:
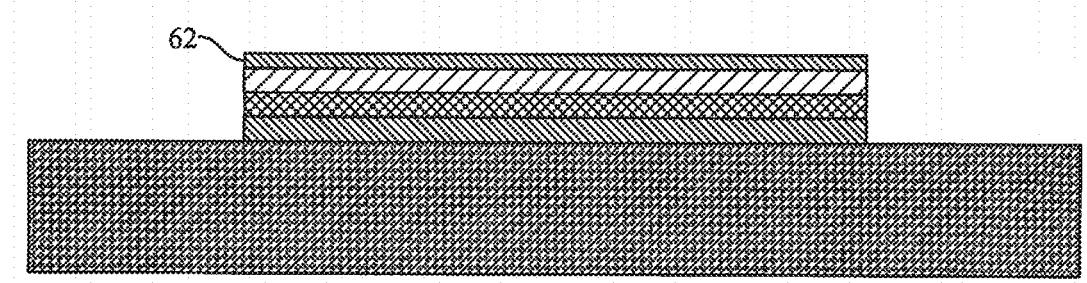
Figure 5D:
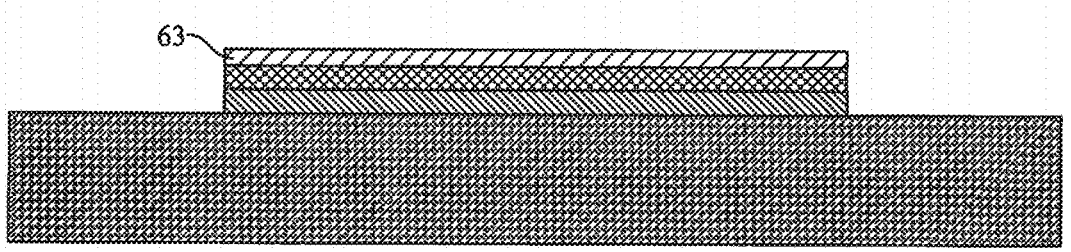
Figure 5E:
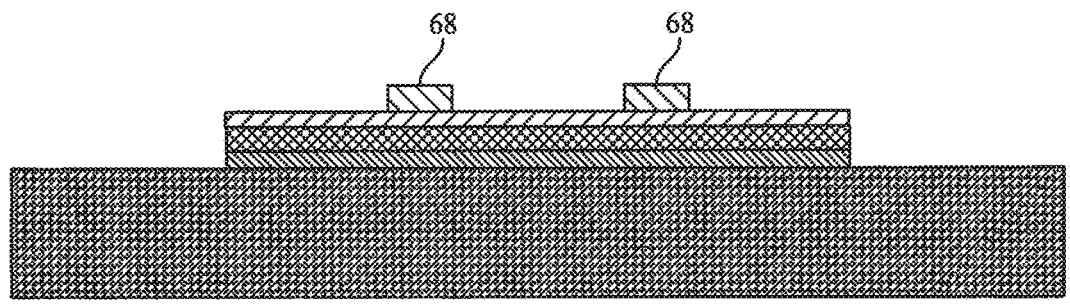
Figure 5F:
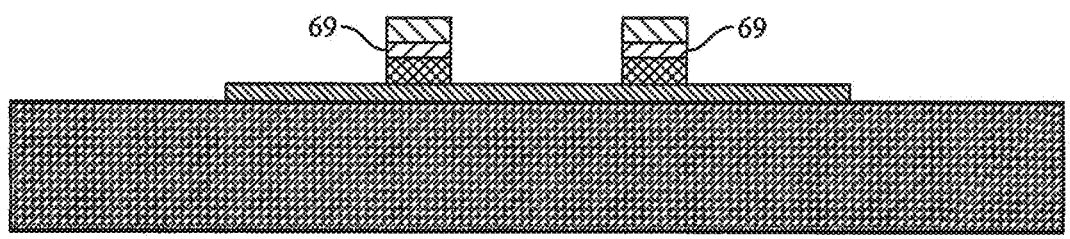
Figure 5G:
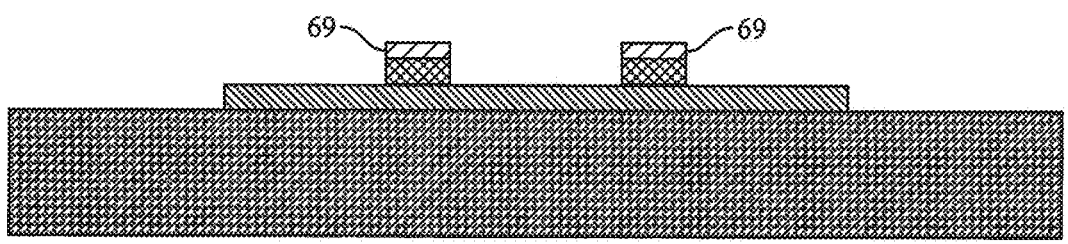
Figure 5H:
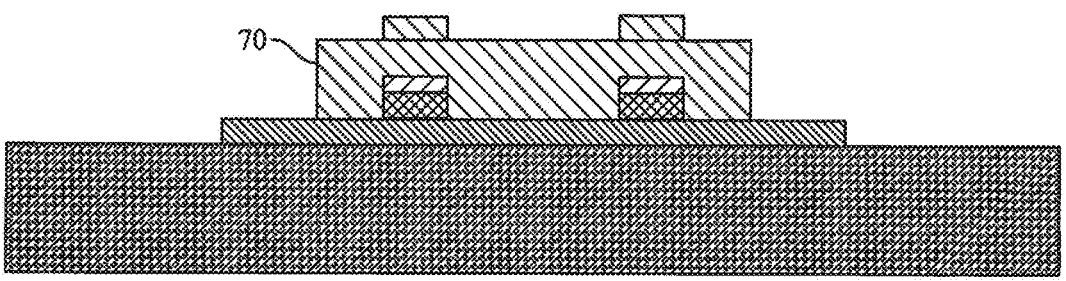
Figure 5I:
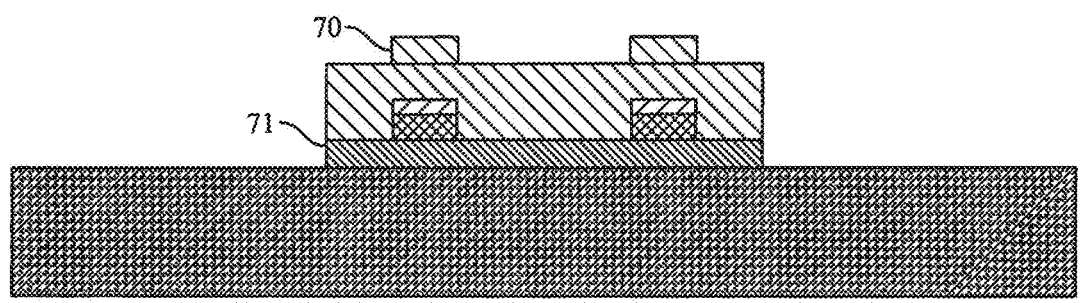
Figure 5J:
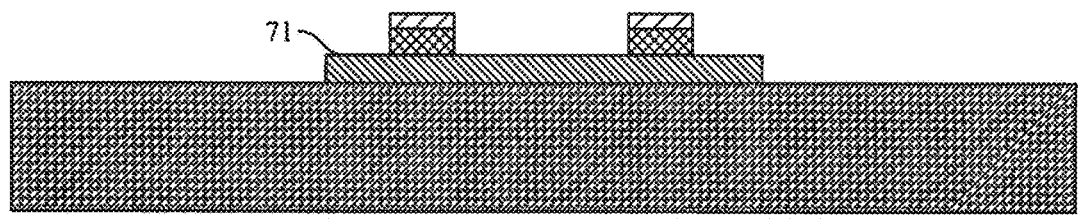
Figure 5K:
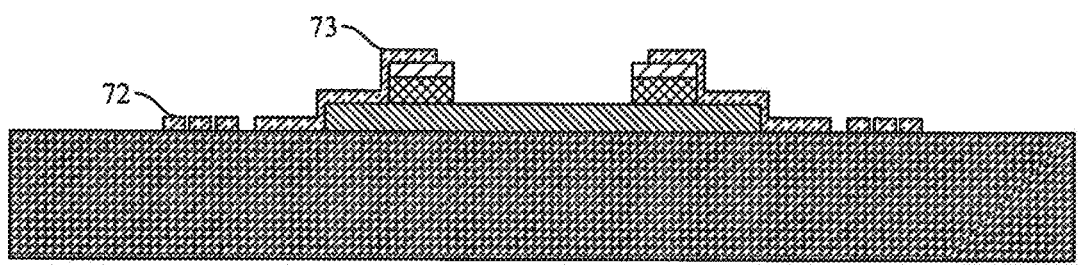
Figure 6:
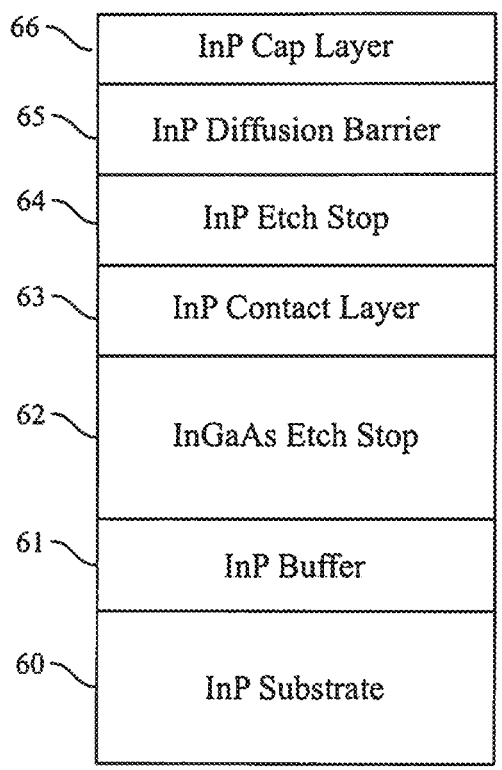

FIG. 6 provides an example stack of III-V epitaxial layers made in accordance with the process of FIGS. 5A-5K.

Figure 7:
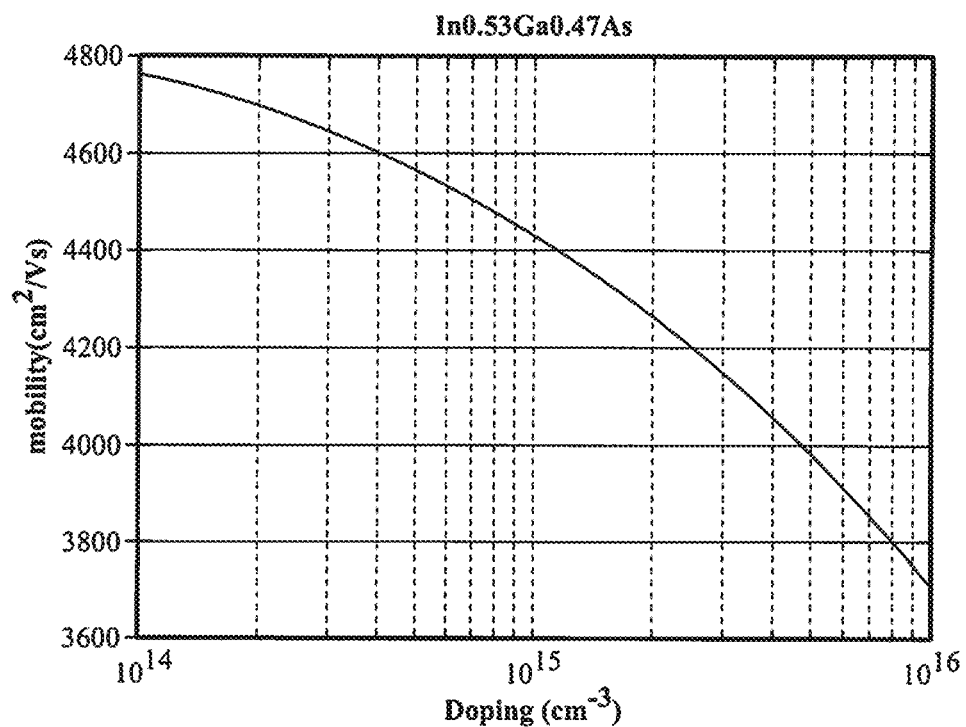

FIG. 7 is a plot of carrier mobility versus dopant density for the example III-V compound $In_{0.53}Ga_{0.47}As$.

FIGS. 8A-8J depict the various stages of an example process for making a device in which an AlN waveguide is grown on a silicon platform.

Figure 8A:
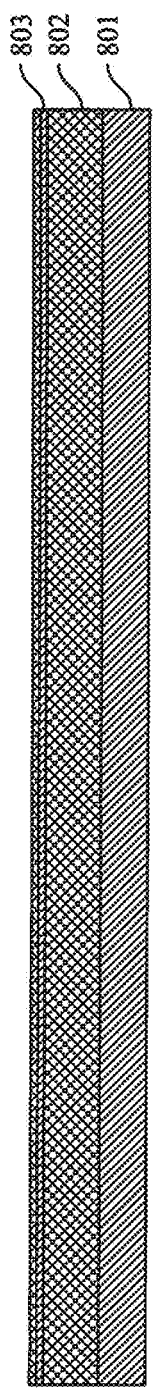
Figure 8B:
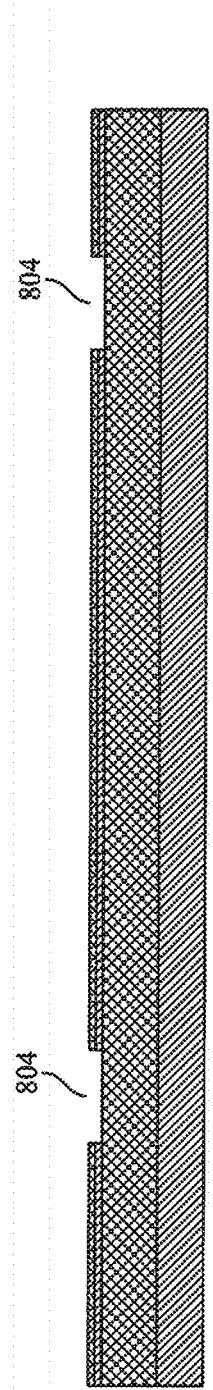
Figure 8C:
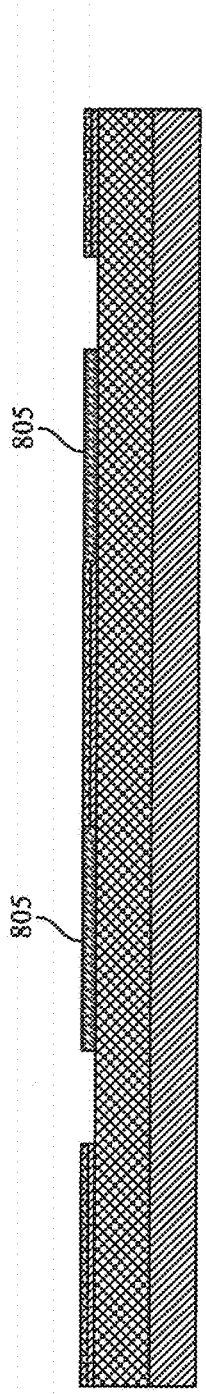
Figure 8D:
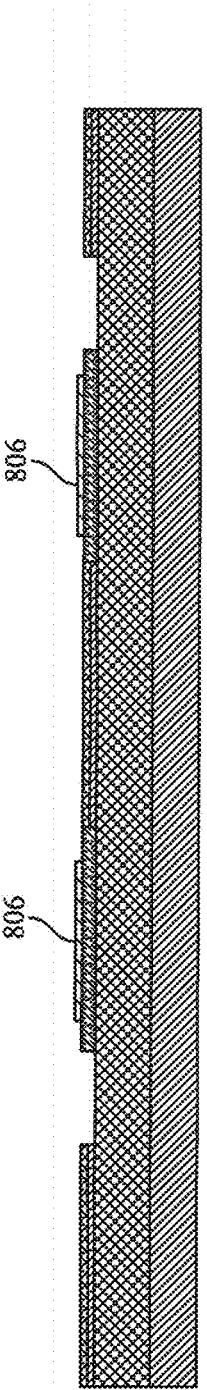
Figure 8E:
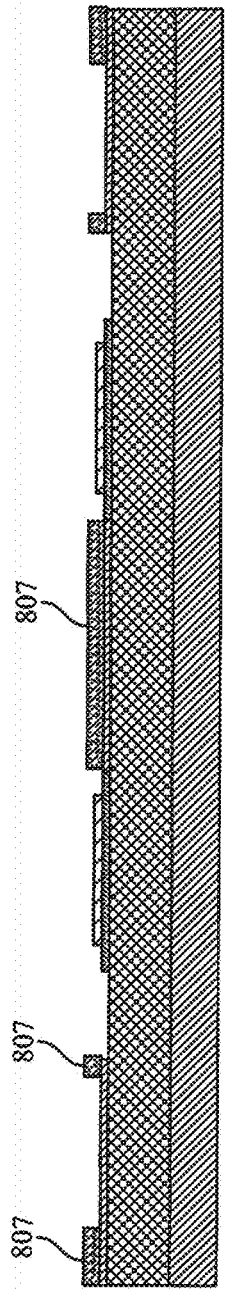
Figure 8F:
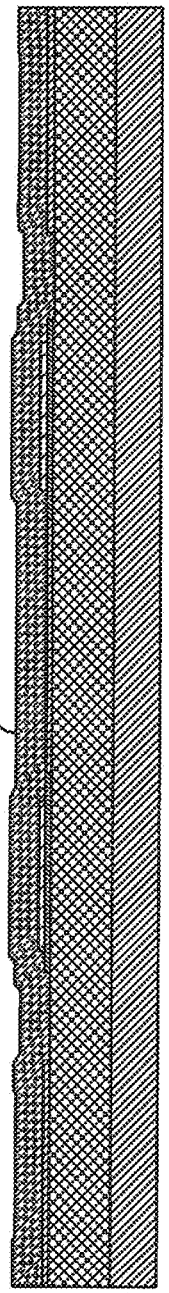
Figure 8G:
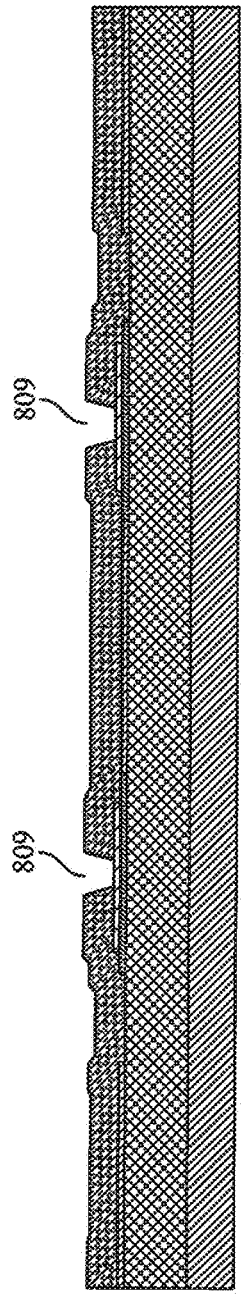
Figure 8H:
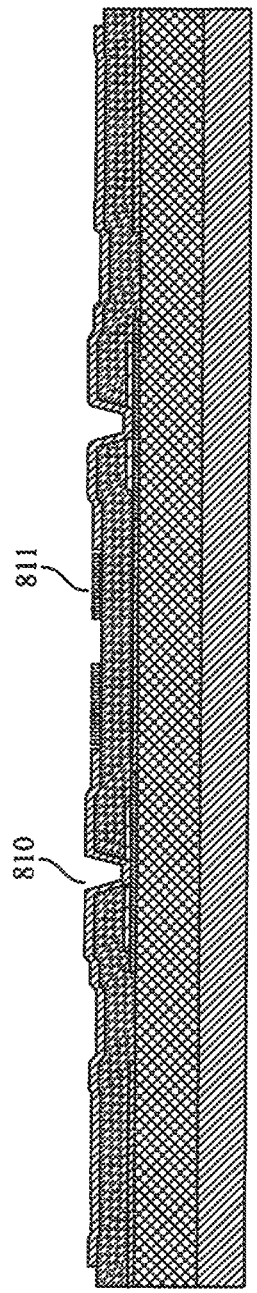
Figure 9:
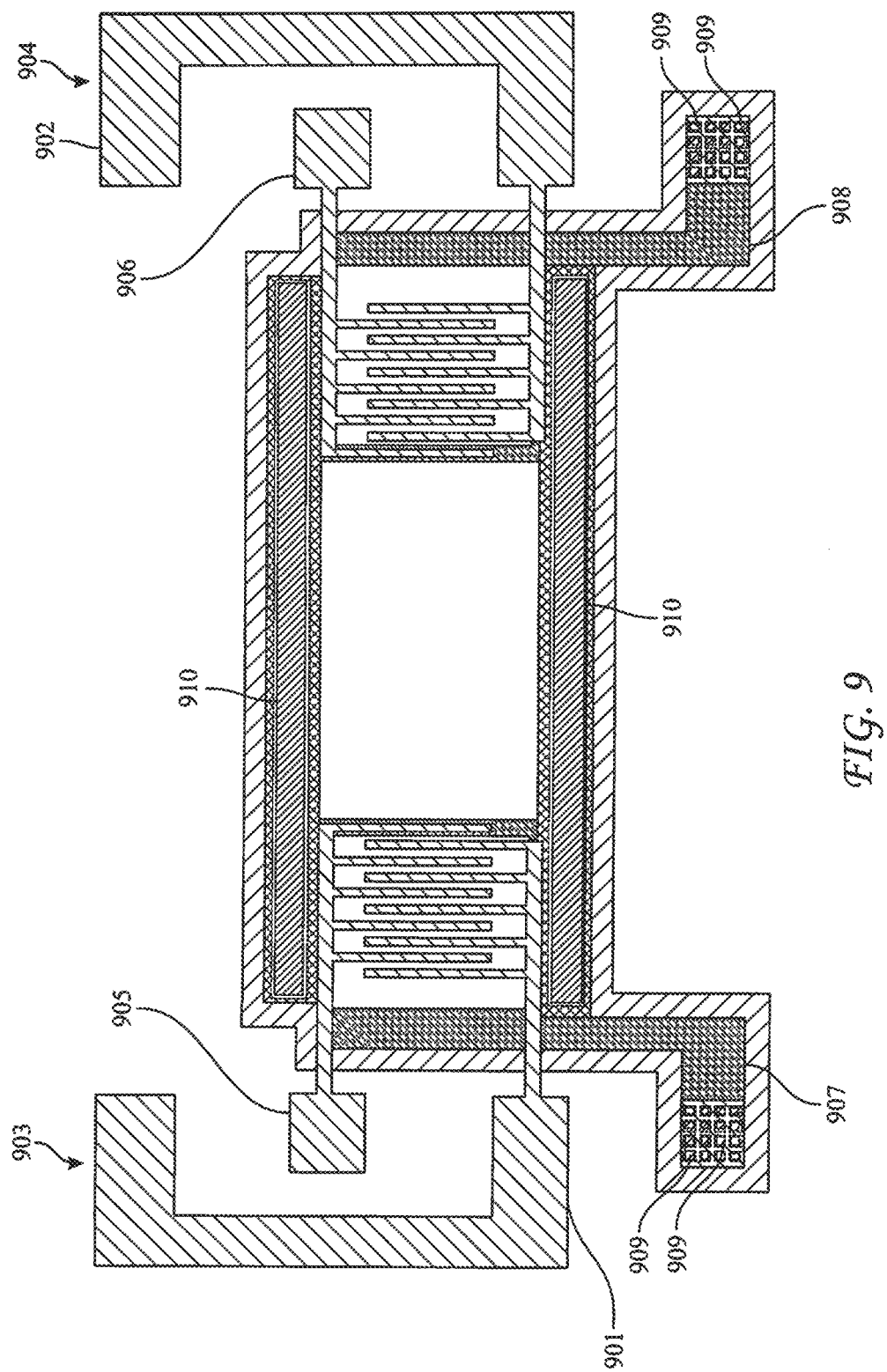

FIG. 9 is a plan view, based on a mask schematic, of an example device made by the process of FIGS. 8A-8H.

FIGS. 10-12 depict initial and final stages of an example process in which a III-V amplifier layer and a lithium niobate waveguide are suspended on a membrane.

DETAILED DESCRIPTION

Figure 1A:
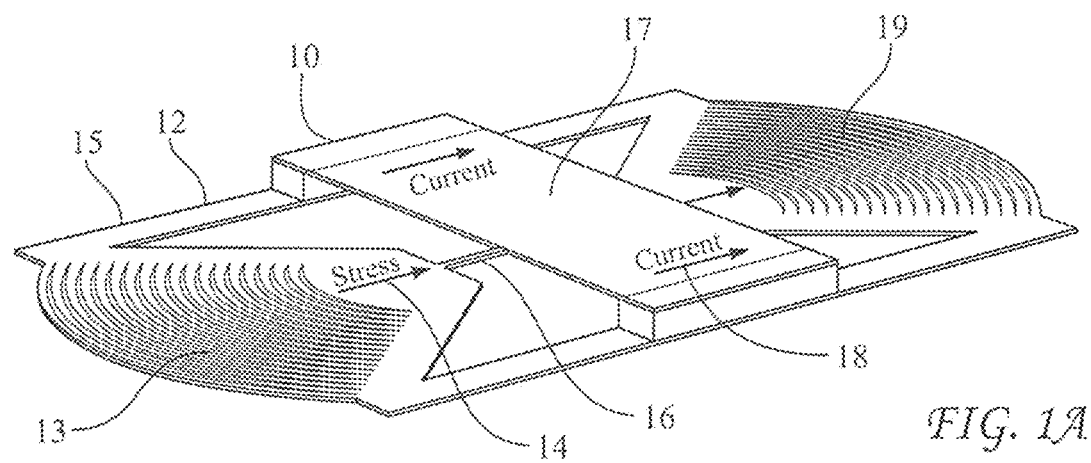
FIG. 1A is a simplified perspective view.
Figure 1B:
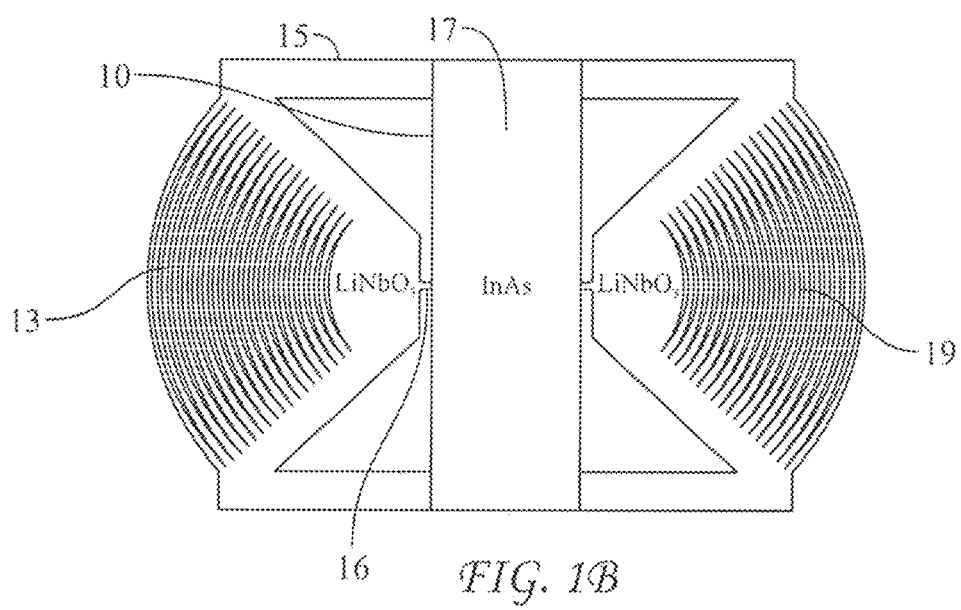
FIG. 1B is a simplified plan view, of an example architecture that implements the principles described here.

FIG. 1A is a simplified perspective view, and FIG. 1B is a simplified plan view, of an example architecture that implements our new ideas. This is a hybrid architecture in which an epitaxial semiconductor element 10 cooperates with a radiofrequency (RF) piezoelectric acoustic element 12. These elements cooperate to provide nonreciprocal gain to RF signals applied to the RF input when a direct current (DC) electric field is applied to the semiconductor element. We believe that in this manner, it is possible to achieve up to 10 dB or more of non-reciprocal gain per millimeter of length, noise figures less than 5 dB, and high power-conversion efficiencies.

Figure 2:
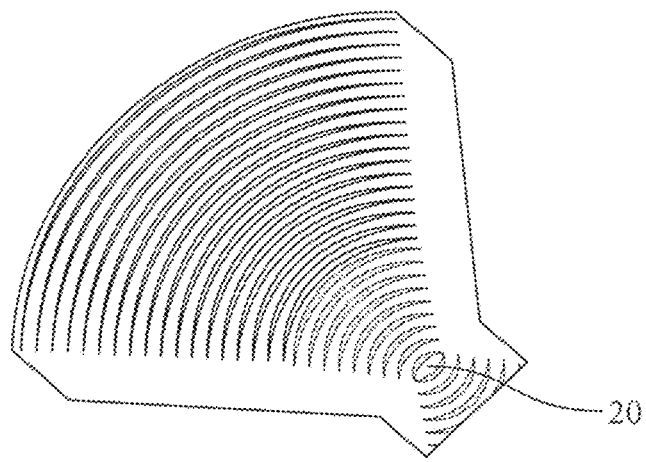
FIG. 2 is a detail of FIG. 1B, providing a magnified view of a focusing interdigitated transducer.

In operation, an RF voltage is applied to a set 13 of metal electrodes of an interdigitated transducer (IDT) on the piezoelectric acoustic element. This launches an RF stress wave 14 (i.e., a radiofrequency acoustic wave) with wavelength λ and velocity $v_a$ into a suspended lithium niobate (LiNbO$_3$; also referred to herein as "LN") film 15 that is much thinner than λ. The IDT is specially designed to focus the beam down to a diffraction-limited spot 20. This is best seen in FIG. 2, which is a detail of FIG. 1B providing a magnified view of the focusing IDT. Most of the power in the stress wave is coupled into an acoustic waveguide 16 that is only λ/2 wide.

As best seen in FIGS. 1A and 1B, the waveguide 16 runs beneath an epitaxially grown indium arsenide (InAs) film 17. Within the film 17, a bias current 18 drives carriers with velocity $v_s$ in the same direction as the acoustic wave. As the acoustic wave propagates, it creates moving packets of localized charge that exert forces on the nearby current carriers through the Coulomb force. If $v_s > v_a$, the carriers attempt to accelerate the acoustic wave, which—due to the fixed speed of sound—creates a reaction force that amplifies the acoustic wave as it travels beneath the semiconductor.

It should be noted in this regard that the acoustic wave may be, among other things, a surface wave (also referred to as a SAW or a Rayleigh wave) or a plate wave. (One example of a plate wave is a Lamb wave, as will be understood by those skilled in the art.) A surface wave propagates in a medium having a thickness that is much larger than the in-material acoustic wavelength. By contrast, a plate wave propagates in a medium that is at most several wavelengths in thickness, and more typically one wavelength or less in thickness.

We have found through numerical simulation that when the acoustic wave is a Lamb wave propagating in a membrane of sub-wavelength thickness, the resulting interaction with the electrical carriers can be appreciably stronger than the interaction due to a surface wave. Our studies predict that an enhancement by almost tenfold would be achievable. A suspended lithium niobate membrane is one example of a medium that can be made sub-wavelength in thickness and that can support a propagating plate wave such as a Lamb wave. The suspended lithium niobate membrane therefore offers a very advantageous approach for achieving the kind of amplification described here.

It is also possible that suspending the lithium niobate membrane may help to prevent acoustic losses.

On the other hand, however, the presence of an air gap between the acoustic waveguide and the semiconductor amplifier can add parasitic frequency dependence that degrades the performance of the device. Hence the desirability of a suspended structure will depend on the needs of specific applications.

Terms such as "above" and "beneath" as used herein are not meant in an absolute sense. They are used for convenience only in referring to the views shown in the various figures. Accordingly, it will be understood that the epitaxial InAs film 17 lies "above" the suspended LN film 15 in the sense that it is shown in a superior position in the drawings. Generally, when structures fabricated on a substrate are shown, the substrate will be at the bottom of the figure, and the added structures will be shown as lying above the substrate.

The amplified acoustic wave exits the waveguide and expands as it propagates toward a second set 19 of electrodes, belonging to a second IDT, that will typically be a mirror image of the electrode set 13. Electrodes 19 convert the acoustic wave back to an RF voltage, but with gain, i.e., with an amplitude greater than the input amplitude. Conversely, if the acoustic wave propagates in the opposite direction, its moving charge packets will be decelerated by the Coulomb drag interaction with the counter-propagating drift carriers. This will have the effect of attenuating the acoustic wave as it propagates. Thus, the Coulomb drag interaction endows the system with nonreciprocal gain.

A comparative example is provided by the surface acoustic wave (SAW) amplifier reported in L. A. Coldren and G. S. Kino, "Monolithic Surface Wave Amplifier", *Appl. Phys. Lett.*, 18, 317 (1971), hereinafter "Coldren (1971)". In that archetypal device, an interdigitated transducer (IDT) at the input end of an LN acoustic delay line launched a 660-MHz SAW wave (wavelength λ of 6 μm; acoustic velocity of about 4000 m/s). The amplified signal was recovered by an IDT at the output end of the delay line. An electrical drift field was applied to a 1-cm-long amplifier region. The amplifier region consisted of a 55-nm-thick indium antimonide (InSb) film overlying the LN substrate and separated from it by a 30 nm silica spacer.

As reported in Coldren (1971), that device achieved an extremely high terminal gain of 60 dB and a non-reciprocity of 110 dB. However, not only the mode of interest, but also every other acoustic mode in the system was amplified if it propagated more slowly than the semiconductor carriers.

Such a non-specific gain is disadvantageous because the other amplified modes compete with the desired mode for power drawn from the amplifier, thus reducing the power efficiency. Also, the output transducer receives the undesired modes as well as the desired mode. This produces a broadband noise floor that reduces the effective gain for the mode of interest.

Another source of broadband noise is the diffusion of the propagating charge carriers. The diffusion is primarily caused by carriers hopping between defect-induced charge traps. For a pure semiconductor, this phenomenon has a theoretical lower bound given by the material's thermal diffusivity. The diffusion gives rise to time-varying amplification that is manifested as broadband noise.

The ratio of the gain to the broadband noise floor is referred to as the noise figure. The noise figure is an important metric for active RF devices. By way of example, Coldren (1971) reported an experimentally measured internal noise figure ranging from about 27 dB at an electronic gain of −10 dB to about 11 dB at an electronic gain of 50 dB.

Until recently, however, it was not possible to provide a substantially defect-free semiconductor body that is also thin enough that acoustic energy does not leak into it and that has a high enough mobility for the condition $v_s > v_a$ to be achieved without unduly large voltages. Historically, this lack relegated the Rayleigh wave amplifier to the status of an academic curiosity instead of a staple of RF signal processing.

Previous studies have shown that if all the unwanted modes of the system were eliminated, and if the defect density were reduced enough for thermal diffusion to dominate the diffusivity, the noise figure of the system would consequently decrease by more than an order of magnitude and the power-conversion efficiency would concomitantly increase. Example studies are reported in L. A. Coldren and G. S. Kino, "CW Monolithic Surface Wave Amplifier Incorporated in A Δv/v Waveguide", *Appl. Phys. Lett.*, 23, 117 (1973), and G. S. Kino and L. A. Coldren, "Noise Figure Calculation for The Rayleigh Wave Amplifier", *Appl. Phys. Lett.*, 18, 317 (1971).

Accordingly, a technical challenge to be overcome has been how to reduce the density of unwanted modes in the system while also reducing the defect density of the semiconductor so that its diffusivity is also reduced.

In our approach, the density of unwanted modes is reduced by reducing the thickness of the piezoelectric membrane to much less than an acoustic wavelength. In some implementations, the mode density is further reduced by using focusing IDTs, as described above, to couple RF power into an acoustic waveguide that is not only sub-wavelength in thickness, but also sub-wavelength in width. It should be noted, however, that the use of a focusing IDT is not a critical requirement.

A suitable focusing transducer is described, for example, in M. Eichenfield and R. H. Olsson, "Design, fabrication, and measurement of RF IDTs for efficient coupling to wavelength-scale structures in thin piezoelectric films," Ultrasonics Symposium (IUS), 2013 IEEE International, pages 753-756, the entirety of which is hereby incorporated herein by reference.

By way of example, we note first that the density of acoustic states scales with the area-normalized cross section. In the architecture of FIGS. 1A and 1B, we believe that this cross section can be reduced to about $(0.3\lambda)^2$, where $\lambda$ is the acoustic wavelength. By contrast, the corresponding area in the archetypal device of Coldren (1971) was more than $(100\lambda)^2$. This implies that a reduction in the density of unwanted modes by a factor on the order of $10^5$ may be achievable.

Another reason why sub-wavelength thicknesses are desired for the acoustic waveguide relates to the profile of the electric field associated with the acoustic wave. To maximize the electromagnetic coupling to the amplifier layer, this field should be concentrated as much as possible outside of the piezoelectric membrane. Our numerical modeling studies have shown that, in fact, the peak intensity of the electric field can occur outside of the piezoelectric membrane if its thickness is smaller than an acoustic wavelength by a sufficient factor. As pointed out above, this can lead to as much as an order-of-magnitude increase in interaction strength relative to surface-wave (SAW) interactions. The stronger interaction is desirable because it can lead to shorter devices, lower noise, and lower voltage requirements for achieving comparable amplifications, as well as lower power consumption and heat dissipation.

A second technical challenge to be overcome has been how to reduce the semiconductor defect-induced diffusivity. This diffusivity must be reduced in a manner that still allows the semiconductor to be placed in intimate contact with the $LiNbO_3$ (or other piezoelectric material) or if not in direct contact, then with an air gap much smaller than the acoustic wavelength $\lambda$. Moreover, the semiconductor material must have a high carrier mobility.

We are meeting this challenge with several different approaches. In one approach, for example, heterogeneous integration techniques are used to transfer epitaxial III-V semiconductor films onto a host substrate. Silicon nitride is an example substance that can serve as a bonding interface. In a second, complementary approach, high-quality silicon nitride films are grown directly on thin $LiNbO_3$ membranes. Combining these two complementary approaches, we believe that by epitaxy, we can grow high mobility, thermal-diffusion-limited III-V films and bond them to $LiNbO_3$ or other piezoelectric materials with no air gap or with an air gap as small as 3 nm.

It should be noted in this regard that we have successfully bonded indium phosphide directly to lithium niobate using a technique to be described below. We anticipate that various other III-V compositions, such as indium gallium arsenide, can likewise be bonded directly to lithium niobate using similar techniques.

In advanced designs, it may be advantageous to match an acoustic waveguide that is tightly confined in two dimensions to an amplifier that is likewise tightly confined in two dimensions. That could be accomplished, for example, by fabricating a two-dimensional conduction channel within a host semiconductor. This could be implemented, for example, in a heterostructure comprising indium phosphide and indium gallium arsenide phosphide.

Example 1: Lithium Niobate Waveguide Bonded to Indium Arsenide Amplifier

FIGS. 3A-3E provide an illustrative example of a process that we believe could be used to make a device in which an indium arsenide (InAs) semiconductor amplifier layer is bonded to a lithium niobate piezoelectric acoustic waveguide layer.

Figure 3A:
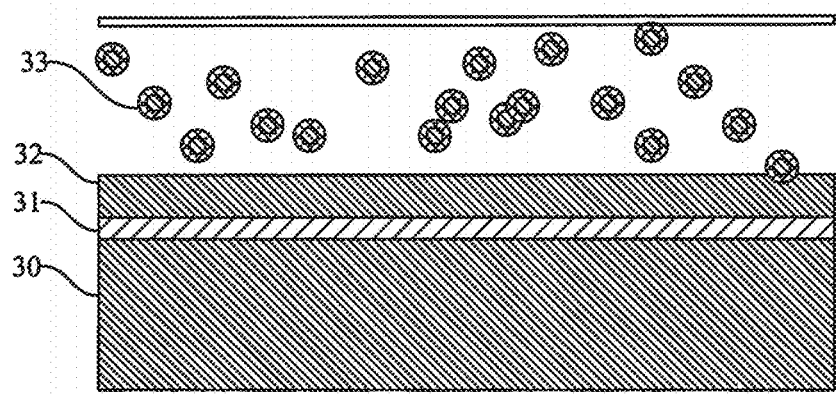

As shown in FIG. 3A, a layer 31 of aluminum antimonide (AlSb) is epitaxially grown on an indium arsenide (InAs) wafer 30. This is followed by epitaxial growth of an InAs amplifier layer 32. An ion implant 33 is performed to impart the desired electronic properties to the InAs amplifier layer 32.

Figure 3B:
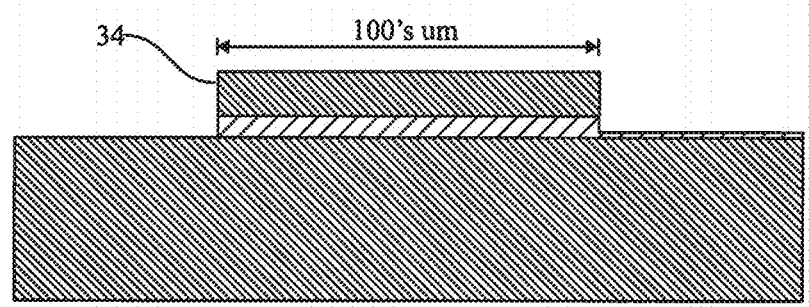

As shown in FIG. 3B, the InAs amplifier layer 32 and the AlSb layer 31 are then patterned and etched to define a mesa 34 that corresponds to the amplifier portion of the device.

Figure 3C:
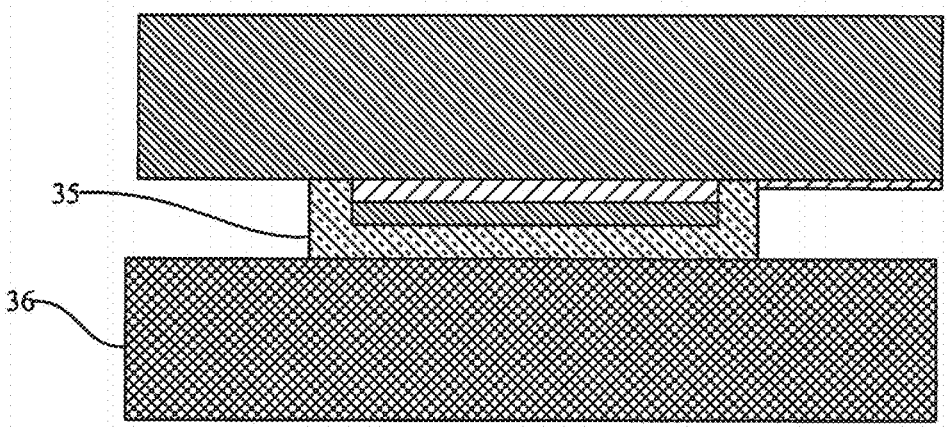

As best seen in FIG. 3C, a bonding and protective layer 35 of silicon nitride (SiN) is then grown by plasma-enhanced chemical vapor deposition (PECVD) over and around the mesa 34 of InAs and AlSb. The wafer is then flipped and the SiN layer 35 is bonded directly to a lithium niobate substrate 36.

As shown in FIG. 3D, the InAs substrate 30 is removed, followed by removal of the SiN 35 from the sides of the mesa and removal of the AlSb layer 31. As shown in FIG. 3E, conventional techniques are then used to add electrical contacts 37 for the amplifier and to add IDTs 38 for the acoustic waveguide.

Example 2: Lithium Niobate Waveguide on InGaAs/InGaAsP Amplifier

FIGS. 4A and 4B provide, respectively, a simplified side-elevational view and a simplified plan view of an example hybrid amplifying device implementing the ideas presented here. As seen in the figures, an indium gallium arsenide (InGaAs) amplifier 41 is bonded to a lithium niobate acoustic waveguide 42. Electrical contacts 43 are provided to the InGaAs amplifier, and contact pads 44 and IDTs 45 are provided to the lithium niobate waveguide.

FIGS. 5A-5K are a sequence of cross-sectional views (not to scale) illustrating the steps in an example process for making the device of FIGS. 4A and 4B. FIG. 6 provides an example of the III-V stack referred to in FIG. 5.

The process flow begins with a III-V substrate 60 and a lithium niobate substrate (not shown in FIG. 6). In the example illustrated here, the III-V substrate is indium phosphide.

A stack of III-V layers is grown epitaxially by metalorganic chemical vapor deposition (MOCVD) on the InP substrate. In the example depicted in FIG. 6, the sequence of layers is InP substrate 60, InP buffer 61, InGaAs etch stop 62, InP contact layer 63, InP diffusion barrier 64, InGaAs amplifier layer 65, and InP cap layer 66. The same stack is shown in FIG. 5A bonded to a lithium niobate wafer 67. In the view of FIG. 5A, the visible layers, in sequence from top to bottom, are InP substrate 60 (InP buffer 61 is shown implicitly), InGaAs etch stop 62, InP contact layer 63, InP diffusion barrier 64, and InGaAs amplifier layer 65.

The purpose of the InP cap layer is to protect the InGaAs surface during the process of bonding the III-V stack to the lithium niobate film.

Examples for the thicknesses and doping levels believed suitable for the various layers are provided in Table 1, below.

TABLE 1

| Layer | Material | Thickness (Å) | Doping Level (cm$^{-3}$) |
| --- | --- | --- | --- |
| Cap | InP | 20 | No intentional doping |
| Amplifier | InGaAs | 1000 | Si: about $1 \times 10^{15}$ |
| Diffusion Barrier | InP | 1000 | Si: $5 \times 10^{16}$ |
| Contact | InP | 1000 | Si: $5 \times 10^{18}$ |
| Etch Stop | InGaAs | 15,000 | No intentional doping |
| Buffer | InP | 5,000 | No intentional doping |
| Substrate | InP | N/A | Semi-insulating |

In our design efforts, we sought to maximize the carrier mobility, because that tends to drive up the gain. We also found that there is a tradeoff when seeking to optimize the dopant density: Peak gain can be achieved at lower applied electric fields when the carrier density is lower, but the gain becomes too sensitive to off-peak changes in the applied field at the lowest carrier-density values. Hence there is generally an optimum choice for the dopant density.

More specifically, we found through numerical modeling that the voltage dependence of the amplifier gain depends on the conductivity-thickness product σd through a relationship of the form $E^* = E_0 + \sigma d / \varepsilon_{eff}$. In this expression, $E^*$ is the applied electric field that gives peak gain, $E_0$ is a reference value of the applied field equal to the acoustic velocity divided by the carrier mobility, and $\varepsilon_{eff}$ is an effective permittivity. Accordingly, the voltage (which produces the applied field) required to achieve a given level of gain above $E_0$ will increase in proportion to σd. It is therefore advantageous to design for a σd value that is relatively low. For material systems of the kinds described here and other material systems having comparable interaction strengths, a useful guideline is to design for σd values of less than 100 μmho.

In designing for the specific system of FIG. 6, we adopted the guideline that αd should be kept less than 100 μmho. Carrier mobility decreases nonlinearly with dopant density as seen, for example, in the illustrative plot of FIG. 7 for the III-arsenide compound In$_{0.53}$Ga$_{0.47}$As.

As shown in FIG. 5A, the InP substrate 60 with its epitaxial stack is bonded to lithium niobate wafer 67, such that the InP cap layer 66 (not shown explicitly in the figure) is nearest the lithium niobate wafer and InP substrate 60 is farthest from the wafer. The InP substrate and epitaxial stack are exemplarily two inches in diameter, and the lithium niobate wafer is exemplarily a single-crystalline, four-inch, y-cut wafer, although other cuts may also be useful and are not excluded.

For best performance, the lithium niobate film should be less than an in-material acoustic wavelength λ, preferably λ/5 or even smaller It should be noted that although the lithium niobate acoustic waveguide may informally be referred to as a "surface acoustic wave (SAW)" device, it is more properly characterized as a plate wave or Lamb wave device because the acoustic wavelength is greater than the thickness.

In experimental trials, we found that in an effective bonding procedure, the wafers are cleaned, plasma activated, and then cleaned again to remove added particles. Then a direct bond between the InP cap layer and the lithium niobate is initiated in air. The assembly is then annealed at 100° C. within the bonding apparatus to strengthen the bond.

In FIG. 5B, the III-V stack is thinned from the back to remove all but about 50 μm of the InP substrate 60. This process is carried out using a spray acid tool or a lapping tool.

In FIG. 5C, a wet etch using, e.g., an HCl-based chemistry removes the rest of the InP substrate. The etch stops at the InGaAs etch stop layer 62. In experimental trials, we discovered that the etching was more pronounced near the center than near the edges of 2-inch-diameter InP trial wafers. The InGaAs etch stop layer 62 is included in the stack to promote uniform thinning of the InP substrate.

In FIG. 5D, a wet etch removes the InGaAs etch stop layer 62 and stops at the InP contact layer 63.

In FIG. 5E, a resist layer 68 is spun on and patterned for the InP contacts.

In FIG. 5F, the InP contacts 69 are defined using a wet etch.

In FIG. 5G, the resist layer 68 is removed.

In FIG. 5H, a resist layer 70 is spun on and patterned for the contact region of the InGaAs amplifier layer 65.

In FIG. 5I, the InGaAs contact region 71 is defined by a wet etch.

In FIG. 5J, the resist layer 70 is removed.

In FIG. 5K, radio-frequency electrodes 72 to the lithium niobate wafer and DC electrodes 73 to the semiconductor contact regions are formed by metal liftoff.

Example 3: Aluminum Nitride Waveguide on Silicon Platform

In another implementation of our design approach, the piezoelectric waveguide is an aluminum nitride (AlN) film. The AlN film is grown directly on a silicon wafer by plasma vapor deposition (PVD). In general, such an implementation would be expected to perform more poorly than the InGaAs-lithium niobate implementation described above, because the piezoelectric coupling coefficients are smaller for AlN than for lithium niobate, and also because carrier mobility is smaller in silicon than in InP. However, some of the potential loss in performance is compensated by the fact that silicon can be made substantially free of defects. Moreover, the AlN—Si system is fully CMOS compatible, thus bringing it within reach of conventional fabrication facilities.

FIGS. 8A-8J depict the various stages of an example process for making a device in which an AlN waveguide is grown on a silicon platform.

In FIG. 8A, the starting material is shown as a silicon-on-insulator (SOI) wafer having a 3-μm layer 801 of buried oxide (BOX) overlain by a 100-nm layer 802 of device silicon, which is overlain by a 20-nm layer 803 of silicon dioxide. The device silicon has a resistivity in the range 13-22 ohm-cm. The device silicon is p-type, with a carrier density on the order of $10^{15}$ cm$^{-3}$.

As shown in FIG. 8B, openings 804 in the device silicon are patterned and etched down to the BOX. These openings will be filled with aluminum nitride in a later step.

As shown in FIG. 8C, the device silicon is patterned for an ion implant, and it is implanted in regions 805 to a carrier density of density of $1\times10^{16}$ cm$^{-3}$ to impart the electronic properties desired for the amplifier. The implant is followed by an anneal.

As shown in FIG. 8D, a 200-nm layer 806 of silicon nitride is deposited by PECVD, patterned, and etched using a fluorine-based chemistry to leave SiN etch-stop features 806 over the implanted silicon regions. These features will be used in a later step to control the etching of vias for electrical routing from the face of the finished article down to the silicon amplifier layer.

It should be noted in this regard that by "SiN" we mean a silicon nitride composition that is approximately $Si_3N_4$, but that is not necessarily stoichiometric.

As shown in FIG. 8E, a 20-nm layer 807 of buffer oxide is deposited, patterned, and etched. The buffer oxide is shown grossly exaggerated in scale for visibility.

As shown in FIG. 8F, a 1.5 μm layer 808 of AlN is conformally deposited by PVD over the buffer oxide.

As shown in FIG. 8G, the vias 809 to the amplifier layer are opened by first etching the AlN with a chlorine-based inductively coupled plasma (ICP) down to the SiN etch stops, and then finishing with a fluorine-based reactive ion etch of the SiN and silicon dioxide.

As shown in FIG. 8H, the exposed silicon surface is cleansed of residual oxide by dipping in 2% hydrofluoric acid. A 250 nm conductive layer of aluminum is then deposited, patterned, and etched to define via conductors 810 and top AlN conductors 811 including IDTs and contact pads.

Figure 8I:
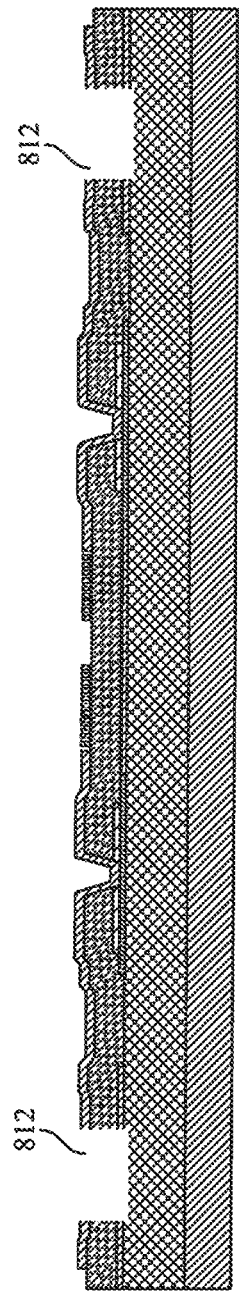

As shown in FIG. 8I, release holes 812 are then etched through the metal conductive layer, the 1.5-μ aluminum nitride, and the device silicon, and AlN, the thermal oxide, and partway into the BOX.

Figure 8J:
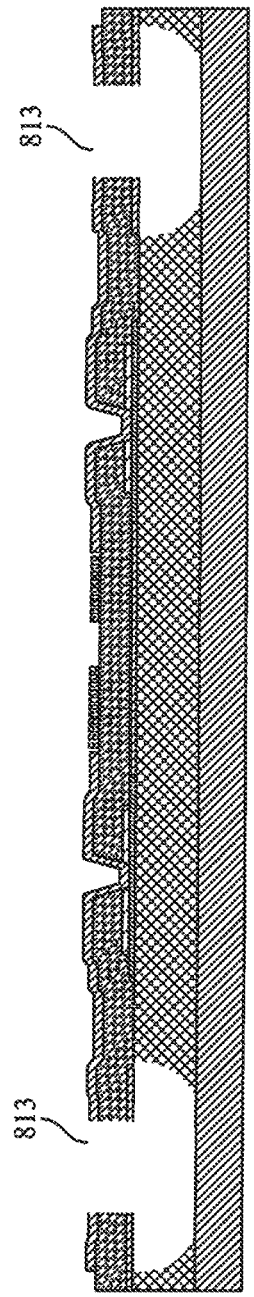

As shown in FIG. 8J, a buffered oxide etchant (BOE) is then introduced through the release holes to remove portions 813 of the BOX layer so that the acoustic waveguide and amplifier are suspended for confinement of acoustic energy.

FIG. 9 is a plan view, based on a mask schematic, of a device as described above. Turning to the figure, it will be seen that features 901 and 902 are respective RF outer electrodes for the transmit IDT 903 and a receive IDT 904. Features 905 and 906, respectively, are the corresponding inner electrodes.

Features 907 and 908 are n+ doped silicon routing lines for the amplifier. These lines can pass directly beneath the top metal lines on the AlN layer, because of the high resistivity of AlN. To prevent stray currents, however, it is desirable to use a high-resistivity device layer, with an n-type carrier concentration that is greater by a factor of 10-100 in the amplifier region. For example, a suitable range for the background doping level could be $2\times10^{14}$ cm$^{-3}$-$4\times10^{14}$ cm$^{-3}$, yielding a resistivity in the range 10-20 Ohm-cm. With a background resistivity in that range, the amplifier region can be selectively doped to a concentration of $4\times10^{15}$ cm$^{-3}$ or even more.

With further reference to FIG. 9, it will be seen that features 909 are the vias to the n+silicon routing lines. Features 910 are the release pits.

Example 4: Suspended Lithium Niobate Waveguide on InGaAs/InGaAsP Amplifier

Another example implementation is similar to Example 2, above, but the amplifier layer and lithium niobate waveguide are suspended on a membrane. The process steps for this implementation will now be described with reference to FIGS. 10-12. Figure elements in common with FIGS. 5A-5K are designated with like reference numerals.

With reference to FIG. 10, a two-inch InP wafer with epitaxial layers as described in Example 2 is bonded to a four-inch lithium-niobate-on-insulator (LNOI) wafer. As indicated in FIG. 10, the sequence of layers within the LNOI wafer is $LiNbO_3$ top layer 1001, $SiO_2$ buried oxide 1002, $LiNbO_3$ handle 1003.

A sequence of processing steps similar to the steps of FIGS. 5B-5K is then carried out.

With reference to FIG. 11, $LiNbO_3$ top layer 1001 is patterned and etched down to the buried oxide 1002 so as to define holes 1004 for facilitating the release etch.

With reference to FIG. 12, the portion of the buried oxide layer underlying the device mesa is etched away by a hydrofluoric acid (HF) release etch, leaving a cavity 1005. This step results in the suspension of a lithium niobate membrane with attached amplifier layer.

What is claimed is:

1. An amplifying radiofrequency (RF) device, comprising a piezoelectric film conformed as an acoustic waveguide having a principal acoustic propagation direction and a semiconductor amplifier layer positioned near the piezoelectric film and having a principle conduction direction parallel to the principal acoustic propagation direction, wherein:

the device further comprises an input interdigitated transducer (IDT) positioned on the piezoelectric film and conformed to launch an acoustic wave having a wavelength λ into the piezoelectric film in response to an input RF signal;

the device further comprises an output interdigitated transducer (IDT) positioned on the piezoelectric film and conformed to intercept the launched acoustic wave and convert it to an output RF signal;

the semiconductor amplifier layer is distant from the piezoelectric film by less than k; and the piezoelectric film has a thickness of less than $\lambda$.

2. The device of claim 1, wherein the piezoelectric film is suspended such that an air gap separates it from the semiconductor amplifier layer.

3. The device of claim 1, wherein the piezoelectric film and the semiconductor amplifier are suspended such that an air gap at least partially separates them from a substrate.

4. The device of claim 1, wherein the piezoelectric film has a width less than $\lambda$ in a direction perpendicular to both its thickness and its principal acoustic propagation direction.

5. The device of claim 1, wherein the piezoelectric film comprises lithium niobate.

6. The device of claim 1, wherein the piezoelectric film comprises aluminum nitride.

7. The device of claim 1, wherein the semiconductor amplifier layer is an epitaxial III-V film.

8. The device of claim 1, conformed as a monolithic device in which the piezoelectric film and the semiconductor amplifier layer are in direct contact without an intervening bonding layer.

9. The device of claim 1, wherein a piezoelectric film of lithium niobate is bonded by a bonding layer to a semiconductor amplifier layer of epitaxial indium arsenide.

10. The device of claim 1, wherein a piezoelectric film of lithium niobate is bonded by a bonding layer to a semiconductor amplifier layer of epitaxial indium gallium arsenide.

11. The device of claim 1, wherein a piezoelectric film of lithium niobate is bonded by a bonding layer to a semiconductor amplifier layer of epitaxial indium gallium arsenide having a conductivity-thickness product of less than 100 µmho-cm.

12. The device of claim 1, wherein a piezoelectric film of aluminum nitride is monolithically bonded to a semiconductor amplifier layer of silicon.

13. The device of claim 1, wherein:

a piezoelectric film of aluminum nitride is monolithically bonded to a silicon substrate;

the silicon substrate comprises a background region and a semiconductor amplifier region;

the background region has a doping level of $4 \times 10^{14}$ cm$^{-3}$ or less; and the semiconductor amplifier region has a doping level of $4 \times 10^{15}$ cm$^{-3}$ or more.

* * * * *